United States Patent [19]

Hietala et al.

[11] Patent Number: 5,111,162
[45] Date of Patent: May 5, 1992

[54] DIGITAL FREQUENCY SYNTHESIZER HAVING AFC AND MODULATION APPLIED TO FREQUENCY DIVIDER

[75] Inventors: Alexander W. Hietala, Cary; Patrick J. Marry, Huntley, both of Ill.

[73] Assignee: Motorola, Inc., Schaumburg, Ill.

[21] Appl. No.: 695,120

[22] Filed: May 3, 1991

[51] Int. Cl.⁵ .................. H03C 3/09; H03L 7/18
[52] U.S. Cl. ..................... 332/127; 331/23; 332/100; 332/103; 332/144; 375/44; 455/76; 455/113; 455/119
[58] Field of Search .............. 332/100, 101, 102, 103, 332/104, 105, 127, 128, 144; 331/23; 375/44; 455/42, 76, 110, 112, 113, 119

[56] References Cited

U.S. PATENT DOCUMENTS

| | | | |
|---|---|---|---|
| 4,800,342 | 1/1989 | Jackson | 331/10 |
| 4,810,977 | 3/1989 | Flugstad et al. | 455/113 X |
| 4,887,050 | 12/1989 | Borth et al. | 331/34 |

Primary Examiner—Siegfried H. Grimm
Attorney, Agent, or Firm—Raymond A. Jenski; Rolland R. Hackbart

[57] ABSTRACT

A fractional-N synthesizer realizes automatic frequency control by adding (509) a digital representation of a determined frequency offset to a digital representation of applied modulation to create the modulus control of a programmable frequency divider (203).

8 Claims, 3 Drawing Sheets

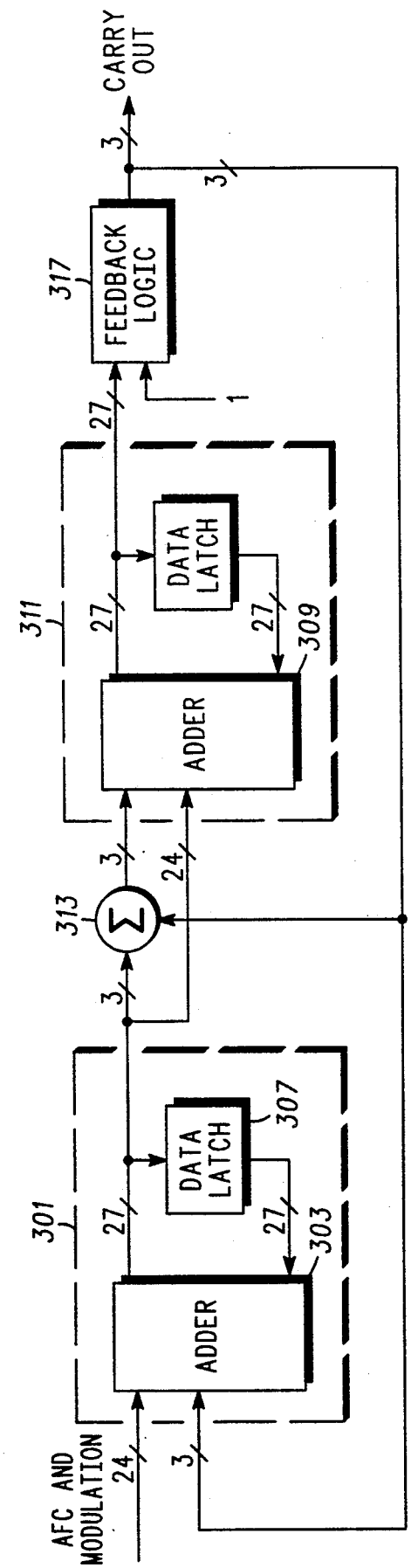

DIGITAL FREQUENCY SYNTHESIZER HAVING AFC AND MODULATION APPLIED TO FREQUENCY DIVIDER

BACKGROUND OF THE INVENTION

This invention relates generally to frequency synthesizers and more particularly to a fractional-N frequency synthesizer employing direct digital automatic frequency control useful in radiotelephone communications equipment.

Phase-locked loop (PLL) frequency synthesis is a well known technique for generating one of many related signals from a frequency variable voltage controlled oscillator (VCO). In a single loop PLL, an output signal from the VCO is coupled to a programmable frequency divider which divides by a selected integer number to provide a frequency divided signal to a phase detector. The phase detector compares the frequency divided signal to a reference signal from another fixed frequency oscillator which, often, is selected for stability of frequency over time and environmental changes. Any difference in phase between the frequency divided signal and the reference signal is output from the phase detector, coupled through a loop filter, and applied to the VCO in a manner which causes the output signal from the VCO to change in frequency such that the phase error between the frequency divided signal and the reference signal is minimized. Since the programmable divider divides by integers only, the output frequency step is constrained to be equal to the reference signal frequency.

In order to overcome the limitations of the single loop PLL, programmable frequency dividers capable of effectively dividing by non-integers have been developed. Output frequency step sizes which are fractions of the reference signal frequency are obtained while maintaining a high reference frequency and wide loop bandwidth. Such synthesizers are commonly known as fractional-N synthesizers and a discussion of fractional-N synthesis may be found in U.S. Pat. No. 4,816,774.

The reference signal frequency for the fractional-N frequency synthesizer is, therefore, determined by the step size of the VCO output frequency multiplied by the denominator of the programmable divider divisor. Fractional-N synthesis allows the use of a reference frequency which is much higher than the actual channel spacing and allows designs to use wider bandwidths due to the reduction of low frequency spurious outputs. Wider bandwidths allow fast lock times and the possibility of wideband modulation applied to the reference input or the fractional division scheme.

Control of the divisor of a programmable frequency divider is usually maintained by way of a multiple bit binary number which is applied to the programmable frequency divider. The binary number for a fractional-N synthesizer is created in a digital network and coupled to the programmable frequency divider. Description of divider controls may be found in U.S. patent application Ser. No. 516,897, (now U.S. Pat. No. 5,055,800) "Fractional N/M Synthesis", filed in behalf of Black et al. on Apr. 30, 1990; U.S. patent application Ser. No. 576,333, "Latched Accumulator Fractional-N Synthesis with Residual Error Reduction", filed in behalf of Hietala et al. on Aug. 31, 1990; and U.S. patent application Ser. No. 576,342, (now U.S. Pat. No. 5,070,310) "Multiple Latched Accumulator Fractional-N Synthesis", filed in behalf of Hietala et al. on Aug. 31, 1990.

Modulation of a fractional-N synthesizer has been accomplished by adding or subtracting a digital value, corresponding to the modulation signal, from the digital number applied to the programmable divider which establishes the divisor value. One such technique of modulation has been described in U.S. patent application Ser. No. 516,993, (now U.S. Pat. No. 5,055,802) "Multiaccumulator Sigma-Delta Fractional-N Synthesis", filed in behalf of Hietala et al. on Apr. 30, 1991. There, modulation is coupled to a fractional-N synthesizer as the sixteen least significant bits of a twenty-four bit channel control number.

Automatic Frequency Control (AFC) of radio equipment is typically achieved by automatically causing fine corrections to the frequency of a reference oscillator based upon a higher stability standard. One example of an AFC derived from an external standard is described in U.S. Pat. No. 4,887,050 in which a frequency offset between a received signal and a digital receiver local oscillator is corrected in substantially one step.

Such AFC networks for digital receivers, however, require a conversion from the digital detection accomplished by the digital receiver to an analog correction signal to be applied to the local oscillator. The conversion requires additional components. Thus, it would be advantageous to realize a digital synthesizer in which the AFC could be combined with the modulation and the digital to analog AFC conversion could be eliminated.

SUMMARY OF THE INVENTION

The present invention encompasses a digital frequency synthesizer with automatic frequency control (AFC) and the capability of modulating an input signal on a carrier signal. The carrier signal frequency is selected by a selected divisor value and the input signal is converted to one of a predetermined plurality of representative numbers. An offset number is generated, corresponding to a difference between the frequency of the carrier signal frequency and a predetermined frequency, and added to the one of a predetermined plurality of representative numbers so that said divisor value may be selected.

BRIEF DESCRIPTION OF THE DRAWINGS

FIG. 3 is a block diagram of a digital network for a fractional-N synthesizer useful in the radio transceiver of FIG. 1.

DETAILED DESCRIPTION OF A PREFERRED EMBODIMENT

Figure 1:
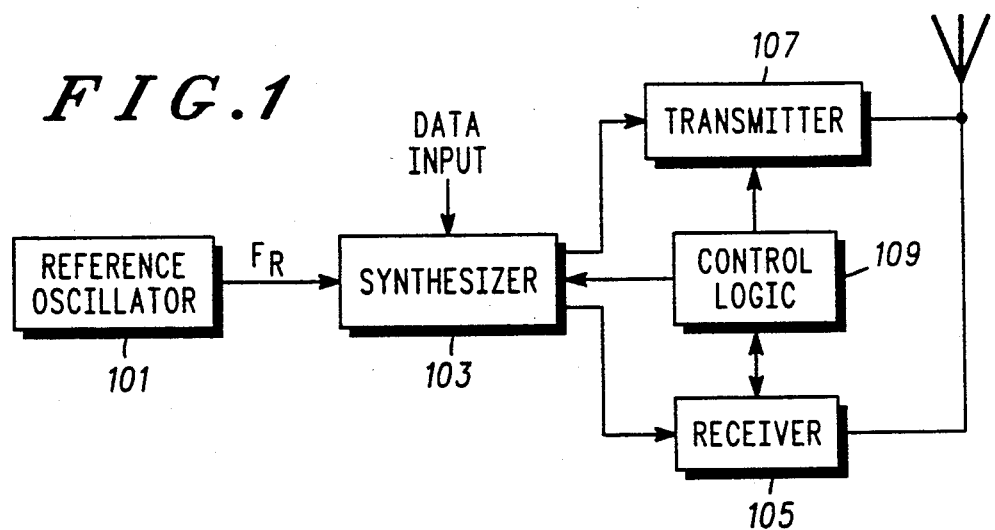
FIG. 1 is a block diagram of a radio transceiver which may employ the present invention.

A digital radio transceiver such as that useful in a digital radiotelephone system and shown in FIG. 1, may advantageously employ the present invention. One variety of digital radio transceivers employing a version of time division multiple access (TDMA) may be employed in the GSM Pan-European digital radiotelephone system. This system requires radio equipment capable of rapid changes of frequency with GMSK modulation for the transmission of digital data and digitized voice.

To achieve the rapid frequency changes and the modulation while maintaining low spurious signal and noise levels, a multiaccumulator fractional-N synthesizer is employed in the preferred embodiment described herein. Proper modulation is realized by a look-up table which converts an input data stream to be transmitted into instantaneous frequency offsets for the fractional-N synthesizer. The loop division value of the synthesizer is adjusted accordingly to follow the instantaneous frequency offset required for the GMSK modulated signal.

As has been described in aforementioned U.S. patent application Ser. Nos. 516,993, "Multiaccumulator Sigma-Delta Fractional-N Synthesis", filed in behalf of Hietala et al. on Apr. 30, 1990; 516,897, "Fractional N/M Synthesis", filed in behalf of Black et al. on Apr. 30, 1990; 576,342, "Multiple Latched Accumulator Fractional-N Synthesis" filed in behalf of Hietala et al. on Aug. 31, 1990; and 576,333, "Latched Accumulator Fractional-N Synthesis with Residual Error Reduction" filed in behalf of Hietala, et al. on Aug. 31, 1990, the fractional-N synthesizer configuration of the preferred embodiment is operated upon with large accumulators to eliminate spurious signals, to provide D/A correction to reduce discrete spurious signals, and to provide direct digital modulation to the PLL. Either ripple or latched accumulators may be used in the present invention without affecting the scope of the invention.

As shown in FIG. 1, a reference oscillator 101 provides a reference signal, $F_r$, which remains relatively constant in frequency over time and extremes of environment and which is applied to frequency synthesizer 103. The output of the synthesizer is used by both the receiver 105 and the transmitter 107 to produce the local oscillator and the modulated transmit signal, respectively. Control over functions of the transceiver, such as channel of operation frequency, is provided by control logic 109 function.

Figure 2:
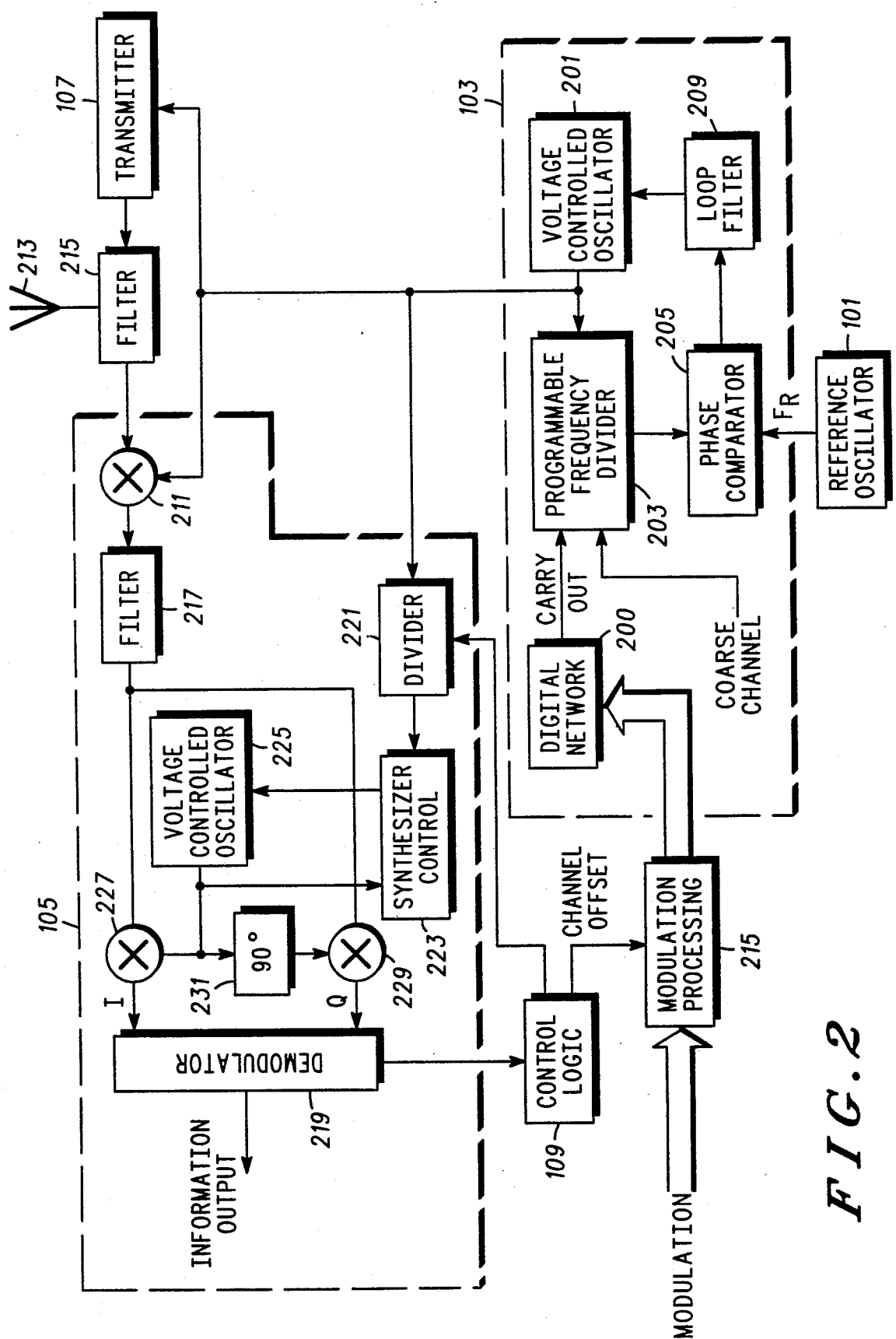
FIG. 2 is a block diagram of a synthesizer for the transceiver of FIG. 1, which may employ the present invention.

The synthesizer 103 of FIG. 2 employs a voltage controlled oscillator (VCO) 201 operating in a band of frequencies between 890 and 915 MHz when supplying a carrier to the transmitter 107, and operating in a band of frequencies between 802 and 827 MHz when supplying a signal to the receiver 105. Other embodiments such as a direct conversion receiver, may employ different frequency bands. The output frequency from the VCO 201 is also coupled to the programmable frequency divider 203 where the frequency of the VCO output signal is divided by a divisor having a value determined by digital network 200 and the coarse channel adjustment. The divided VCO output signal frequency is compared in a phase comparator 205 to the signal $F_R$ from the reference oscillator 101. The resulting comparison output from the phase comparator 205 is coupled to a conventional loop filter 209 and then, as a control signal, to the VCO 201.

When the synthesizer 103 is providing a local oscillator signal to the receiver 105, the VCO 201 supplies a signal to a receiver mixer 211 which converts a signal received by an antenna 213 and coupled through a filter 215 to a frequency which, after filtering by a filter 217, can be demodulated by demodulator 219. The output signal from VCO 201 is also coupled to a divider 221 before being applied to the frequency synthesizer control network 223. The signal from divider 221 then acts as the reference for the receiver second local oscillator which comprises the VCO 225 and synthesizer control 223. The divider 221 divisor is determined by control logic 109. The output of second VCO 225 is coupled to a mixer 227 and to a mixer 229 via phase shifter 231. An in phase signal (I) and a quadrature phase signal (Q) are developed from the converted received signal and output as information from demodulator 219. The quadrature signals may also be combined in the demodulator 219 and the control logic 109 as shown in U.S. Pat. No. 4,887,050 so that the channel offset from the control logic 109 represents a difference in frequency, if any, between the signal received and the output signal from the VCO 201. The channel offset is coupled to the modulation processing network 215 without having to be converted from the digital domain to an analog signal.

Referring now to FIG. 3, a block diagram is shown for a second order (two-accumulator) ripple digital network for a fractional-N synthesizer having, in the preferred embodiment, an adder length, D, equal to a large number ($2^{24}$). A first accumulator 301 accepts a twenty four bit input from the modulation processing network 215 as the least significant bits (LSB) to a 27 bit adder 303 and three feedback bits are input as the three most significant bits (MSB) of the input to the adder 303. The output from the adder 303 (27 bits wide) is input to a data latch 307.

Figure 4:
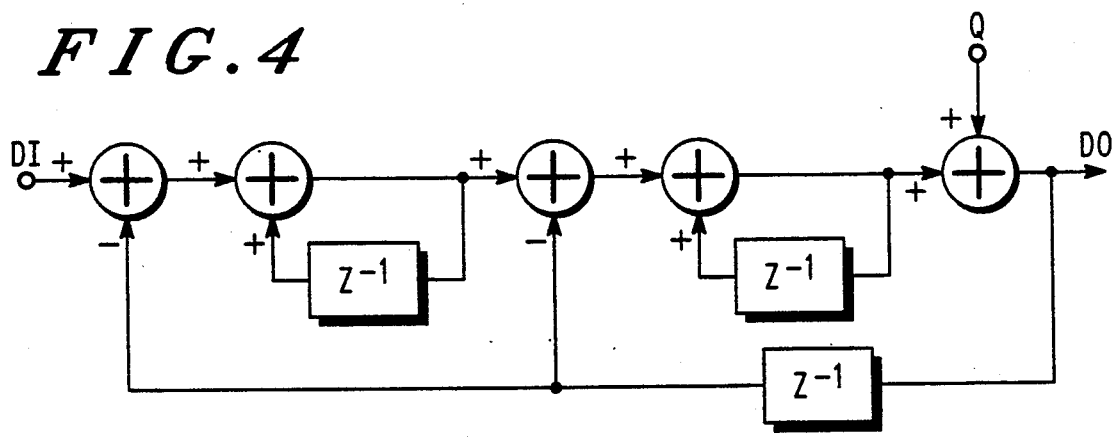
FIG. 4 is a Z-transform diagram of a second order ripple accumulator for the digital network of FIG. 3.

The output from the data latch 307 is coupled to the adder 303 to enable the accumulator to provide integration of the modulation processing network 215 output number. The output from the adder 303 is also split into three MSB and twenty four LSB bits; the twenty four LSB are coupled to an adder 309 in a second accumulator 311. The three MSB are added to the feedback three MSB in a three-bit adder 313, with the result being coupled to the adder 309. The integrated twenty-seven bit output from a second accumulator 311 is coupled to a 27 bit adder (feedback logic) 317 which creates a signed three bit output by considering whether the adder 309 sum is less than $-2D$, less than $-D$, greater than $+D$, or greater than $+2D$. The three MSB output from the feedback logic 317 are coupled, as CARRY OUT, to the programmable frequency divider 203. The three MSB bits are also fed back from the feedback logic 317 to the first accumulator 301 and to the three bit adder 313. Thus, a second order digital network 200, having a Z-transform model as diagrammed in FIG. 4, is employed in the fractional-N synthesizer of the preferred embodiment.

The modulation information is applied to the modulation processing network 215 as shown in FIG. 2 as the sixteen least significant bits of the twenty-four LSB of the channel control. In a transceiver designed in compliance with the GSM system, the data rate is 270.83333 kb with a BT product of 0.3. This results in a frequency of about 81 kHz which must be passed with low distortion through the PLL as modulation.

Figure 5:
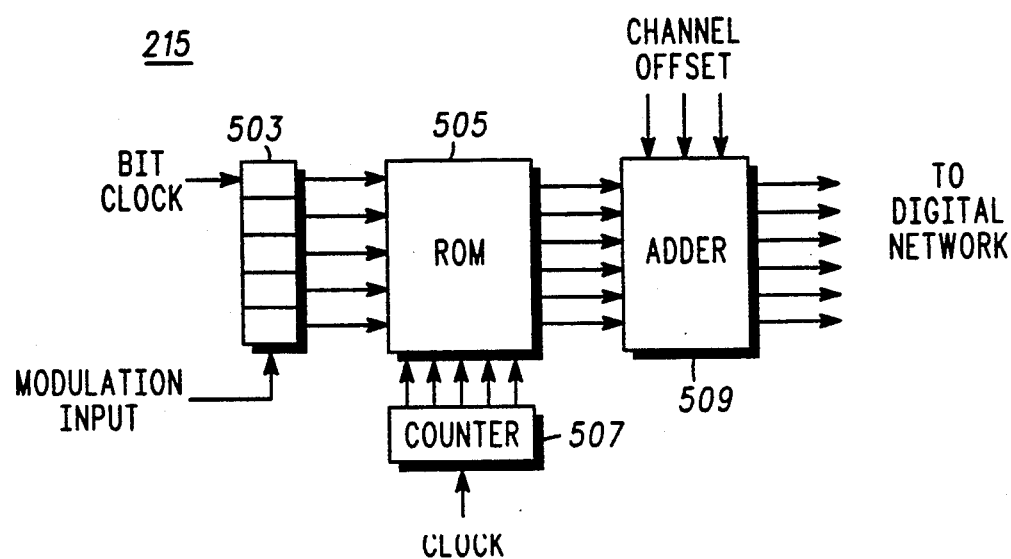
FIG. 5 is a block diagram of the modulation processing network of FIG. 2, which may employ the present invention.

FIG. 5 is a block diagram of the modulation processing network 215. In the preferred embodiment, the modulation data to be transmitted from the transmitter 107 is clocked into the shift register 503. For the transceiver to be employed in the GSM radiotelephone system, the incoming modulation data (digitized voice, facsimile, etc.) will be operated upon five bits at a time to determine the frequency trajectory of the transmitted signal. Accordingly, during each bit clock cycle there are 32 frequency versus time patterns available ($2^5$) and each of these patterns are stored in the conventional ROM 505. The data is serially loaded into the shift register 503 so that the present and the four previous bits are available. These five bits are input as the address MSB to ROM 505 and point to the ROM location which has the needed frequency versus time pattern. Then the pattern is output by using a clock to drive a conventional counter 507 which sequentially addresses the ROM locations via the address LSB of the ROM 505 to generate the frequency versus time pattern. On the next bit clock time the shift register 503 advances and a new frequency versus time pattern is pointed to and subsequently clocked out to a three-input adder 509. In the preferred embodiment, the clock is a sixteen times multiple of the bit clock.

The channel offset, which is output from the control logic 109, represents a fine automatic frequency control (AFC) derived from the received signal and is input to two ports of the three input adder 509. The control logic 109 determines the AFC value during the receive time slot of the GSM radiotelephone system and applies a sixteen bit wide AFC to the LSB of the output of the ROM 505 by way of the adder 509. The digital addition results in an offset to the modulation data applied to the digital network 200. This technique of coupling fine AFC information to the synthesizer loop results in the reduction of analog to digital converters and oscillator warping circuitry from a conventional AFC implementation.

What is claimed is:

1. A digital frequency synthesizer with automatic frequency control (AFC) and the capability of modulating an input signal on a carrier signal having a frequency, comprising:
   means for dividing the carrier signal frequency by a selected divisor value;
   means for converting the input signal to one of a predetermined plurality of representative numbers;
   means for generating an offset number corresponding to a difference between the frequency of the carrier signal and a predetermined frequency; and
   means for adding said offset number to said one of a predetermined plurality of representative numbers whereby said divisor value may be selected.

2. A digital frequency synthesizer in accordance with claim 1 further comprising:
   second means for dividing the frequency of the carrier signal by a second divisor value; and
   means, coupled to said second means for dividing, for generating a signal essentially equal in frequency to said carrier signal frequency divided by said second divisor value.

3. A digital frequency synthesizer having the capability of modulating an input signal on a carrier signal having a frequency and of controlling the carrier signal frequency relative to a predetermined frequency, comprising:
   means for generating the carrier signal;
   means, coupled to said means for generating the carrier signal, for dividing the carrier signal frequency by a selected divisor value;
   means for converting the input signal to one of a predetermined plurality of representative numbers;
   means for generating an offset number corresponding to a difference between the frequency of the carrier signal and the predetermined frequency; and
   means for adding said offset number to said one of a predetermined plurality of representative numbers to produce a control signal which is coupled to said means for dividing to select said divisor value.

4. A digital frequency synthesizer in accordance with claim 3 further comprising:
   second means for dividing the frequency of the carrier signal by a second divisor value; and
   means, coupled to said second means for dividing, for generating a signal essentially equal in frequency to said carrier signal frequency divided by said second divisor value.

5. A method of digital frequency synthesis employing automatic frequency control (AFC) and the capability of modulating an input signal on a carrier signal having a frequency, comprising the steps of:
   dividing the carrier signal frequency by a selected divisor value;
   converting the input signal to one of a predetermined plurality of representative numbers;
   generating an offset number corresponding to a difference between the frequency of the carrier signal and a predetermined frequency; and
   adding said offset number to said one of a predetermined plurality of representative numbers whereby said divisor value may be selected.

6. A method in accordance with the method of claim 5 further comprising the steps of:
   dividing the frequency of the carrier signal by a second divisor value; and
   generating a signal essentially equal in frequency to said carrier signal frequency divided by said second divisor value.

7. A method of digital frequency synthesis employing the modulating of an input signal on a carrier signal having a frequency and the controlling of the carrier signal frequency relative to a predetermined frequency, comprising the steps of:
   generating the carrier signal;
   dividing the generated carrier signal frequency by a selected divisor value;
   converting the input signal to one of a predetermined plurality of representative numbers;
   generating an offset number corresponding to a difference between the frequency of the carrier signal and the predetermined frequency; and
   adding said offset number to said one of a predetermined plurality of representative numbers to produce a control signal which is coupled to said means for dividing to select said divisor value.

8. A method in accordance with the method of claim 7 further comprising the steps of:
   dividing the frequency of the carrier signal by a second divisor value; and
   generating a signal essentially equal in frequency to said carrier signal frequency divided by said second divisor value.

* * * * *